United States Patent
Mihara et al.

[11] Patent Number: 5,560,803
[45] Date of Patent: Oct. 1, 1996

[54] PLASMA ASHING METHOD WITH OXYGEN PRETREATMENT

[75] Inventors: Satoru Mihara, Kawasaki; Daisuke Komada, Kasugai, all of Japan

[73] Assignees: Fujitsu Limited, Kawasaki; Fujitsu VLSI Limited, Kasugai, both of Japan

[21] Appl. No.: 351,212

[22] Filed: Nov. 30, 1994

[30] Foreign Application Priority Data

Feb. 3, 1994 [JP] Japan .................................... 6-11259

[51] Int. Cl.⁶ .......................... H05H 1/00; H01L 21/00
[52] U.S. Cl. .................................. 156/643.1; 156/646.1; 216/69
[58] Field of Search ........................ 156/643.1, 646.1, 156/345; 134/1; 216/69, 64, 67

[56] References Cited

U.S. PATENT DOCUMENTS

| | | | |
|---|---|---|---|
| 4,689,112 | 8/1987 | Bersin | 156/345 X |
| 4,961,820 | 10/1990 | Shinagawa et al. | 156/643.1 |
| 5,294,292 | 3/1994 | Yamashita et al. | 156/643.1 |
| 5,298,112 | 3/1994 | Hayasaka et al. | 156/643.1 |

FOREIGN PATENT DOCUMENTS 4-242920  8/1992  Japan.

*Primary Examiner*—Thi Dang
*Attorney, Agent, or Firm*—Staas & Halsey

[57] ABSTRACT

A method for ashing a resist on a wafer in a plasma reaction chamber comprises the steps of flowing a non-activated oxygen containing gas into the plasma reaction chamber immediately before loading the wafer to the plasma reaction chamber, and then carrying out a plasma ashing of the resist. In one of the preferred embodiments, after the reaction chamber was exposed to the atmosphere and then evacuated to vacuum, a mixed gas of oxygen (90% in volume) and water vapor (10% in volume) was flown into the reaction chamber with 1000 sccm and 1 Torr for 5 min. and subsequently the ashing was carried out. The method prevents the ashing rate from decreasing with ashing time.

13 Claims, 8 Drawing Sheets

PLASMA ASHING METHOD WITH OXYGEN PRETREATMENT

FIELD OF THE INVENTION

The present invention relates to a method for plasma ashing of photoresist on semiconductor wafers, and more specifically relates to a method for ashing photoresist with oxygen pretreatment of a reaction chamber.

DESCRIPTION OF THE PRIOR ART

It has been known that adding water vapor to an oxygen plasma generally enhances an ashing rate, and more particularly in a down-stream type ashing, has additional favorable effects on ashing photoresist on semiconductor wafers so that essentially no chemical etching of the semiconductor wafers and no corrosion of aluminum interconnections occurs. Instability of the ashing rate is a drawback of the down-stream type ashing by a water vapor added oxygen plasma. The instability is considered to be related to adsorption and desorption processes of water molecules on an inside wall of the reaction chamber. FIG. 1 shows changes of the ashing rate from the initial value after the reaction chamber was exposed to the atmosphere for repair and maintenance, in spite of the fact that the chamber was evacuated to vacuum before ashing. Attempts have been made to stabilize the ashing rate, such as performing a pretreatment by an oxygen plasma followed by an ashing process, or controlling a surface temperature of the inside wall of the reaction chamber. However, such attempts have failed to stabilize the ashing rate. For instance, as shown in FIG. 2, a pretreatment by the oxygen plasma has indeed recovered the ashing rate temporally, but does not maintain it, because the surface temperature of the inside wall of the reaction chamber is raised by the oxygen plasma itself, which evntually decreases the ashing rate.

SUMMARY OF THE INVENTION

It is an object of the present invention to provide a method for ashing a resist in a plasma reaction chamber which comprises the step of keeping a non-activated oxygen containing gas flowing into the plasma reaction chamber immediately before carrying out plasma ashing of the resist.

It is another object of the present invention to provide a method for ashing a resist in a plasma reaction chamber which comprises the steps of evacuating the plasma reaction chamber, generating an oxygen plasma in the plasma generation chamber, flowing a non-activated oxygen containing gas into the plasma reaction chamber, and loading the wafer having the resist thereon into the plasma reaction chamber for ashing.

The phrase "non-activated oxygen containing gas" means that gas molecules are neither ionized nor in an excited state, but in the ground state in the gas. A typical example is a neutral oxygen molecule ($O_2$) excluding oxygen ions (such as $O^{+2}$), a neutral reactive oxygen species ($O^*$), or ozone ($O_3$).

The non-activated oxygen containing gas, as a practical matter, selected from the group consisting of an essentially pure oxygen gas, a mixed gas of oxygen and water vapor, essentially the same mixed gas as a gas used for an ashing process, and a mixed gas of oxygen and any of inert gases. The pretreatment of the plasma reaction chamber by the non-activated oxygen containing gas can stabilize the ashing rate even after the plasma reaction chamber is exposed to the atmosphere.

BRIEF DESCRIPTION OF DRAWINGS

The present invention will be more apparent from the following description, when taken in conjunction with the accompanying drawings, in which.

DESCRIPTION OF THE PREFERRED EMBODIMENTS

Figure 4:
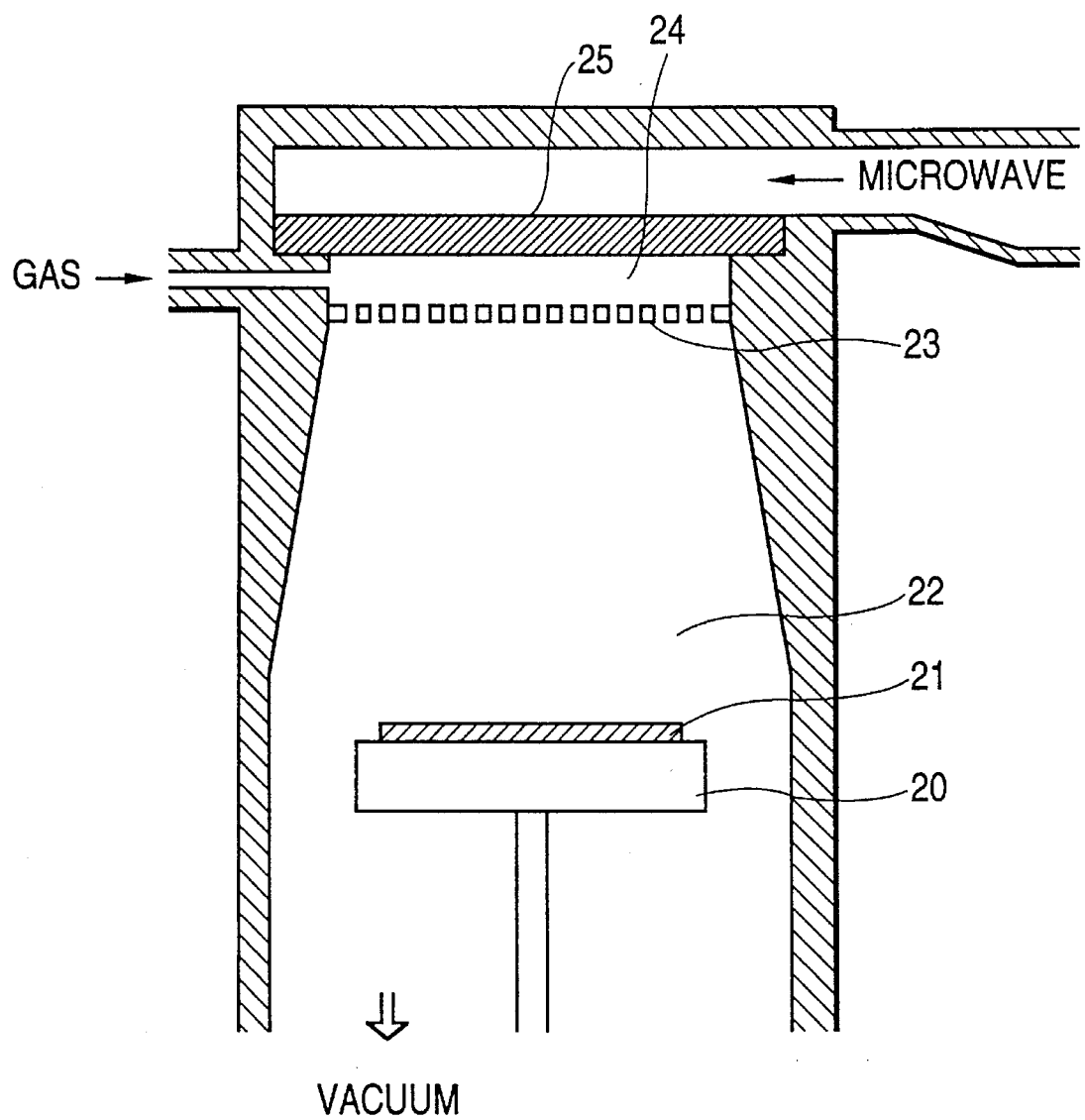
FIG. 4 shows a cross-sectional view of a down-stream type ashing apparatus according to the present invention. A plasma reaction chamber 22 is separated from a plasma generation chamber 24 by a shower-head 23 through which only neutral reactive species are allowed to reach a wafer 21 to be ashed.

In the following embodiments, a down-stream type ashing apparatus was used, as shown in FIG. 4. A wafer 21 to be ashed was placed on a wafer stage 20 heated at temperatue of 220° C. A microwave power level of 1.5 Kw at 13.56 MHz was supplied to a plasma generation chamber 24 through a quartz glass window 25. A plasma reaction chamber 22 was separated from the plasma generation chamber 24 by a shower-head 23 through which only neutral reactive species were allowed to reach the wafer 21. The wafer 21 was set apart from the shower-head 23 at such a distance that ions or microwaves leaking into the plasma reaction chamber 22 decayed sufficiently. Ashing conditions and pretreatment of an oxygen flow to measure the ashing rate were the same throughout the embodiments as shown in TABLE 1 unless otherwise indicated.

Figure 5:
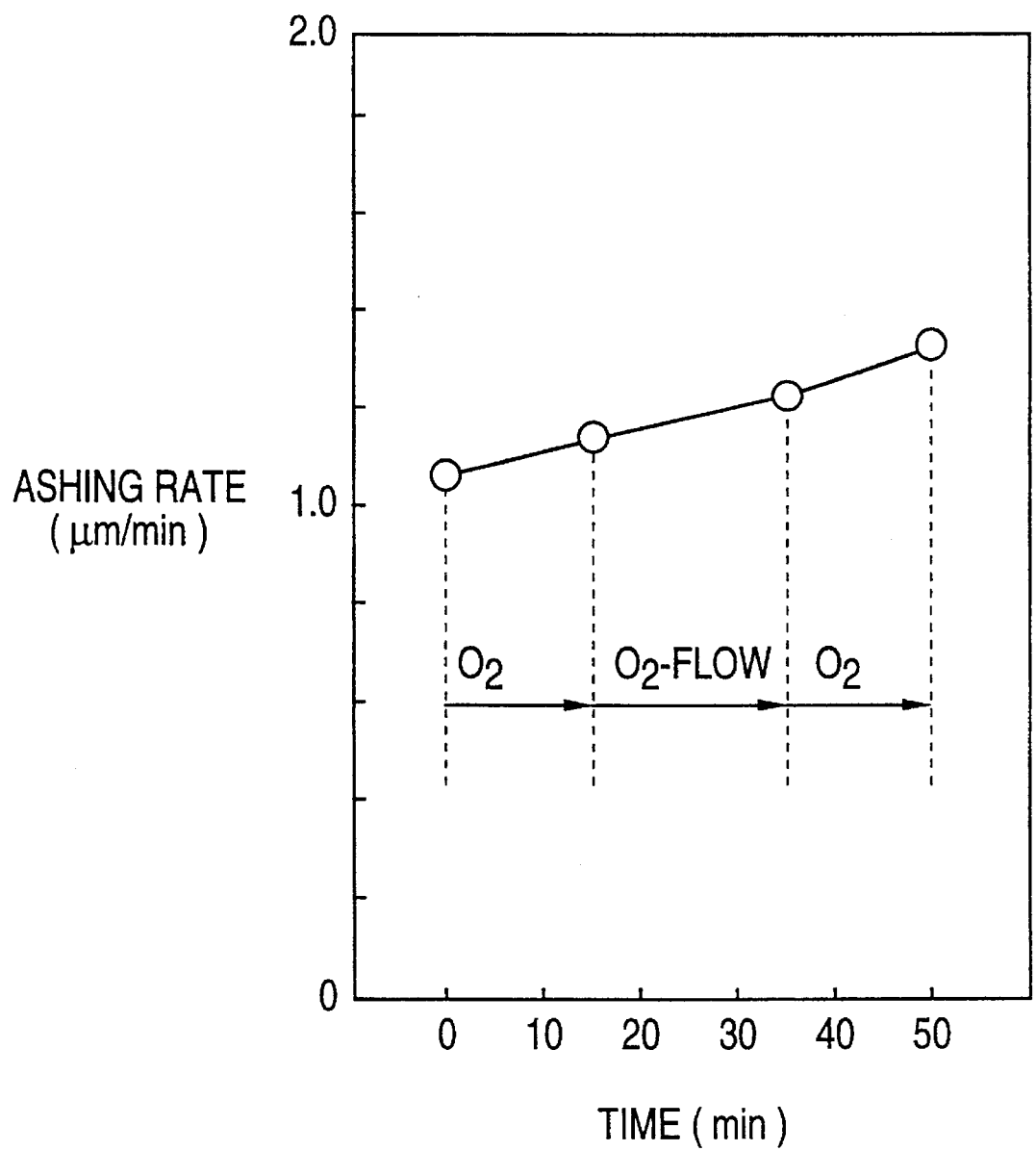
FIG. 5 shows time-dependence of an ashing rate for the first embodiment according to the present invention. After the reaction chamber is exposed to the atmosphere, vacuum pretreatment is followed by a oxygen flow. The oxygen flow recovers the ashing rate gradually.

In the first embodiment, the reaction chamber was evacuated down to a pressure of ~$10^{-4}$ Torr (1 Torr=133.3224 Pa) after being exposed to the atmosphere, and the initial ashing by a mixed gas of oxygen and water vapor resulted in a decrease of the ashing rate, for the same reason as in the prior art, and then a neutral oxygen gas was flowed into the reaction chamber for five minutes with a flow-rate of 1000 sccm and a pressure of 1 Torr. As shown in FIG. 5, the ashing rate recovered gradually, with three sets of consecutive oxygen flows, each of which was immediately followed by an ashing operation to measure the ashing rate. Table 1 below shows the preferred operating conditions.

TABLE 1

| Ashing | | Pretreatment | |
|---|---|---|---|
| $O_2$ | 900 sccm | $O_2$ | 1000 sccm |
| $H_2O$ | 100 sccm | Pressure | 1.0 Torr |
| Pressure | 1.0 Torr | Duration | 5 minutes |
| μ-wave | 1.5 KW | | |
| temperature of stage | 220° C. | | |
| temperature of the inside wall | 40–50° C. | | |
| Ashing time | 30 sec | | |

In the second embodiment, after the decrease of the ashing rate, for the same reason as in the first embodiment, the process gas, of oxygen (90% in vol.) and water vapor (10% in vol.), was flowed for five minutes with a flow-rate of 900 sccm for oxygen and 100 sccm for water vapor (10%), and a pressure of 1 Torr before each ashing.

Figure 6:
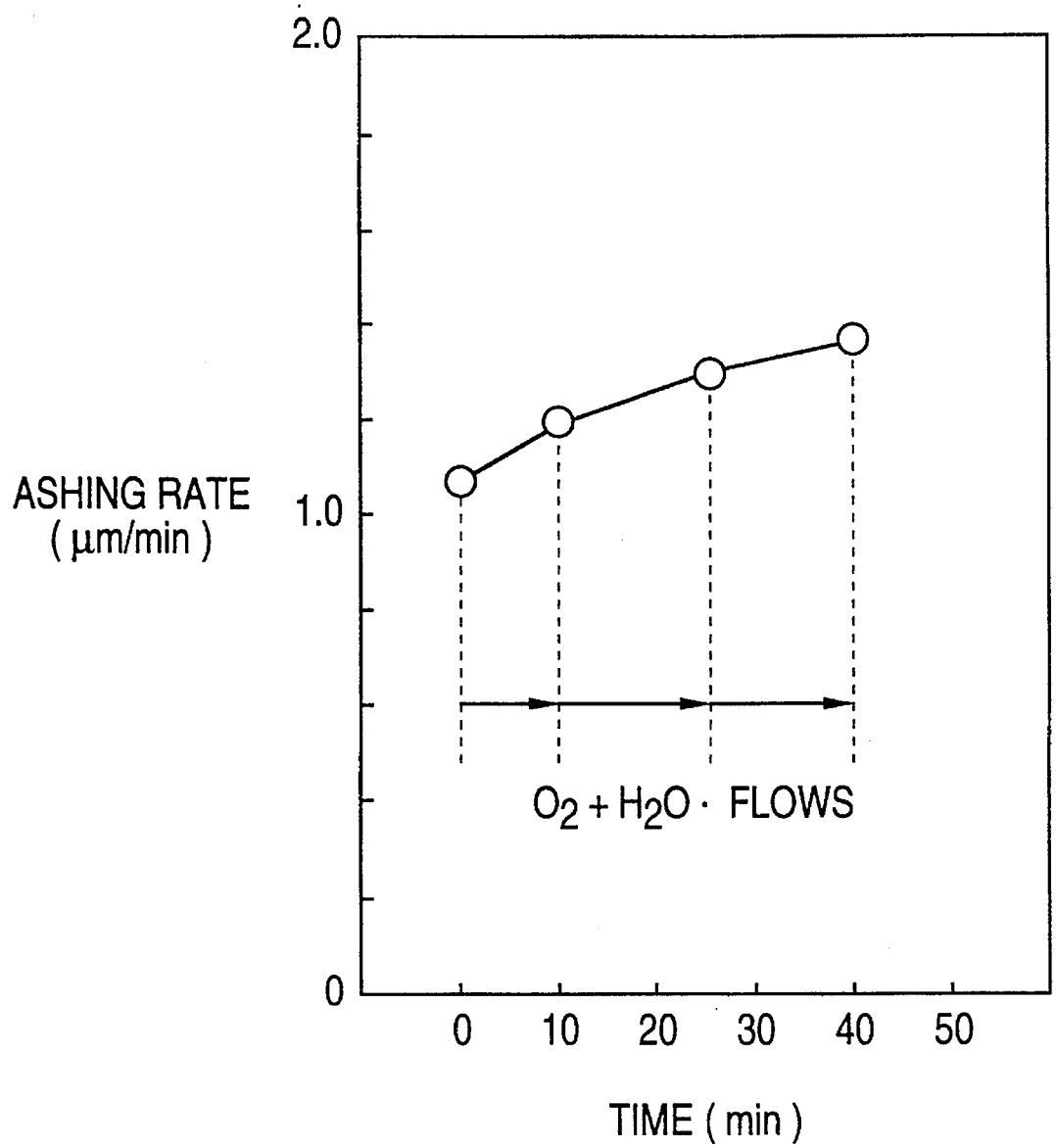
FIG. 6 shows time-dependence of an ashing rate for the second embodiment according to the present invention. After the reaction chamber is exposed to the atmosphere, vacuum pretreatment is followed by flowing a mixed gas of oxygen (90%) and water vapor (10%). Flow of the mixed gas recovers the ashing rate similarly to the oxygen flow.

As shown in FIG. 6, the ashing rate recovered gradually for three consecutive sets of process gas flows, each of which was immediately followed by an ashing operation to measure the ashing rate.

Figure 1:
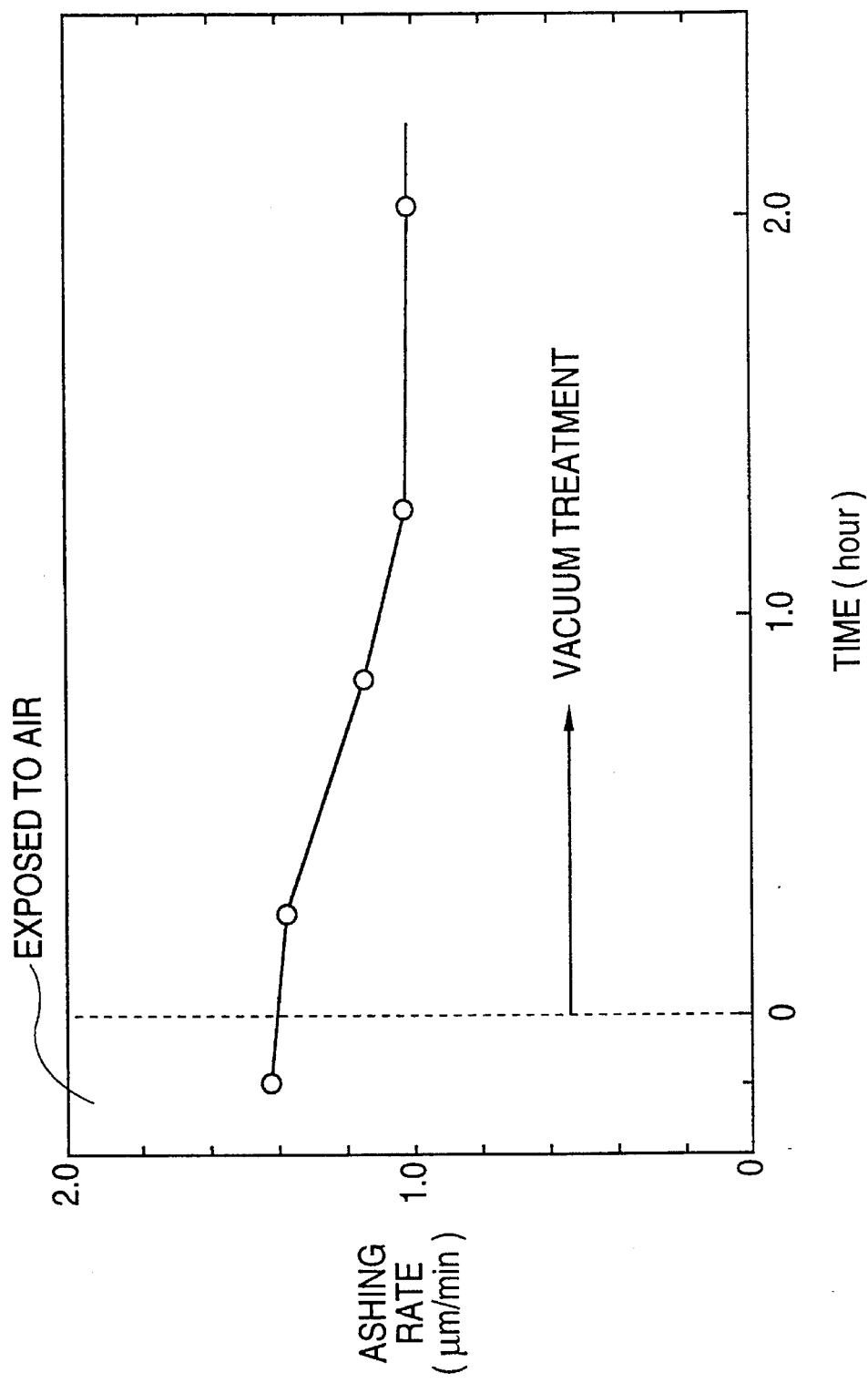
FIG. 1 is a graph showing time-dependence of an ashing rate by a mixed gas of oxygen and water vapor with vacuum pretreatment for every ashing, according to a typical prior art procedure after the reaction chamber is exposed to the atmosphere. As shown therein the ashing rate decreases gradually with ashing time.
Figure 2:
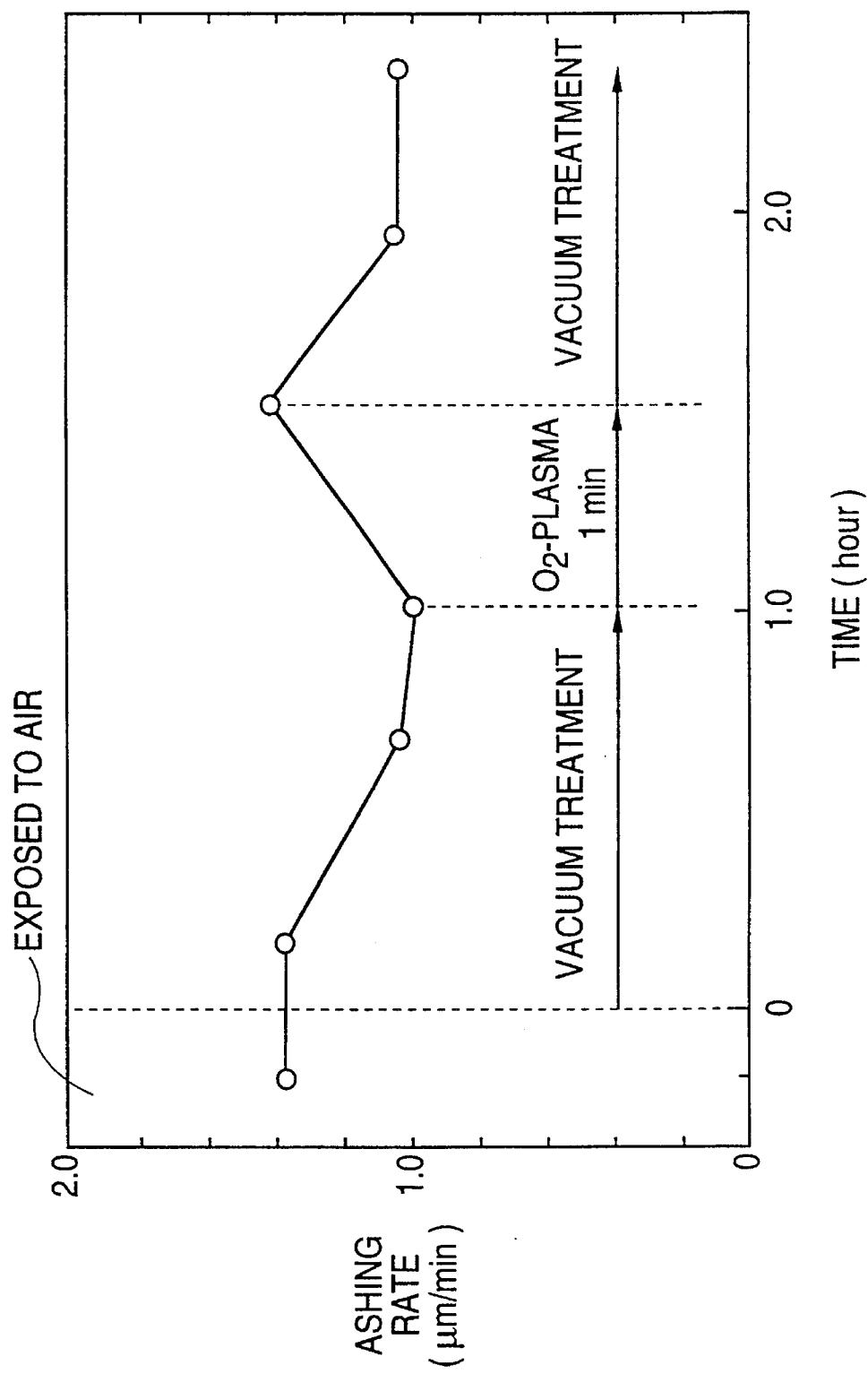
FIG. 2 shows time-dependence of an ashing rate with vacuum pretreatment for the ashing, according to a typical prior art process after the reaction chamber is exposed to the atmosphere. Pretreatment by oxygen plasma recovers the ashing rate, but only temporarily.
Figure 7:
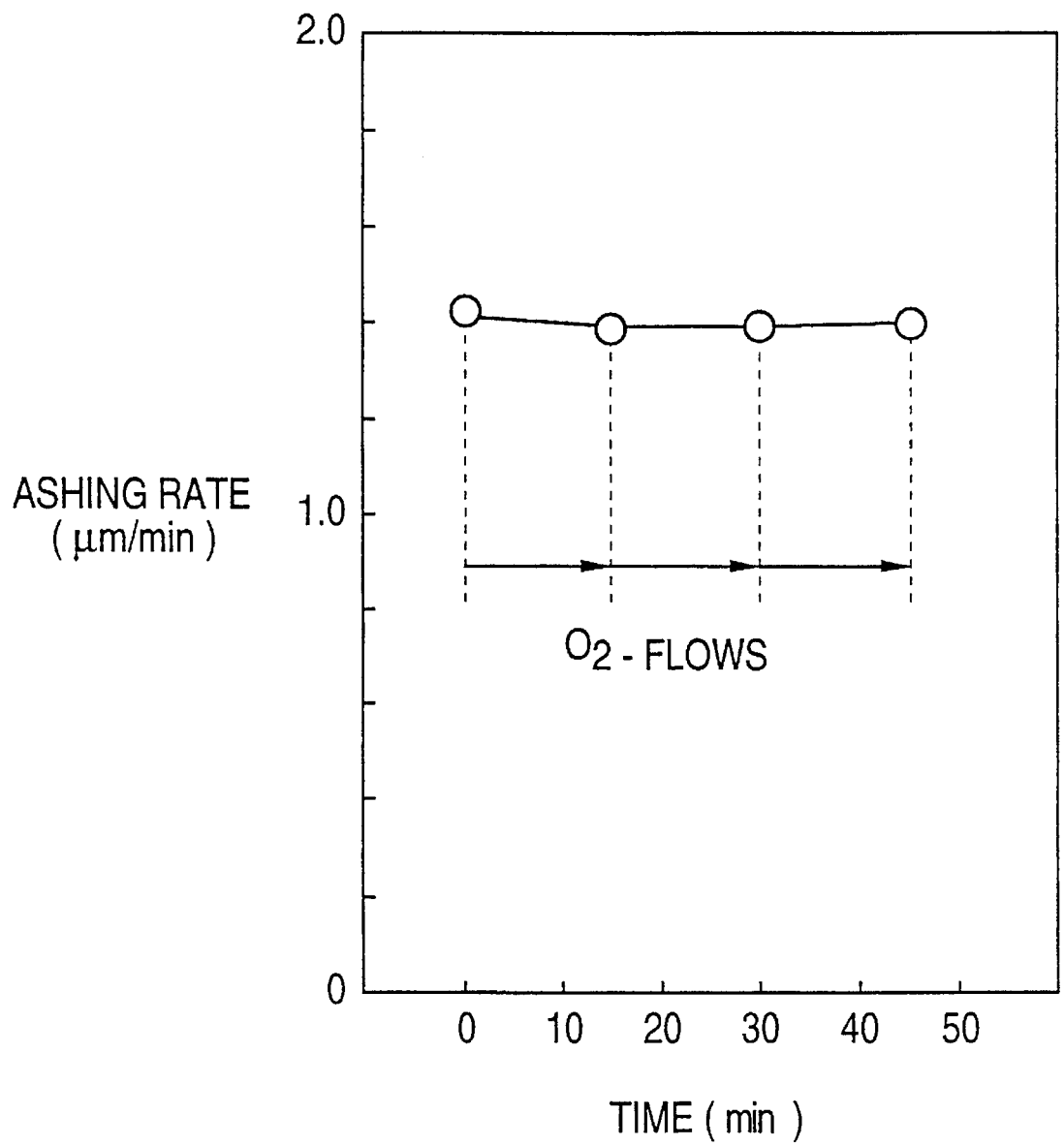
FIG. 7 shows time-dependence of an ashing rate for the third embodiment according to the present invention. After the reaction chamber is exposed to the atmosphere, vacuum pretreatment is followed by an oxygen plasma and subsequently flowing an oxygen gas. The oxygen gas flow maintains the high initial ashing rate.

In the third embodiment, the same series of operations were carried out up to the end of the 60 second oxygen plasma as shown in FIG. 2, and subsequently three consecutive sets of an oxygen flow and an ashing operations to measure the ashing rate were performed. The result shown in FIG. 7 indicates no decrease after the oxygen plasma, unlike in FIG. 2.

Figure 8:
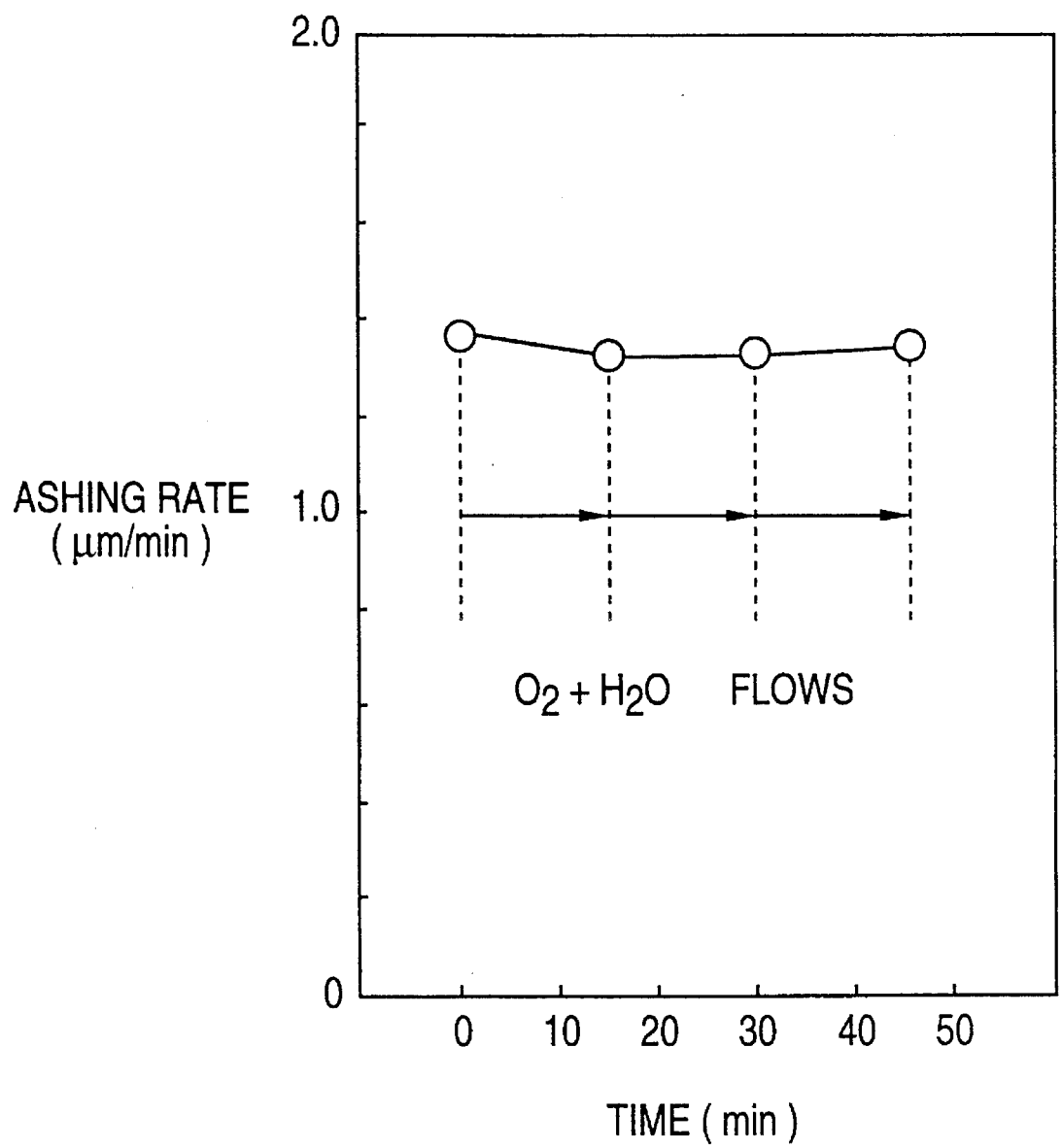
FIG. 8 shows time-dependence of an ashing rate for the fourth embodiment according to the present invention. After the reaction chamber is exposed to the atmosphere, vacuum pretreatment is followed by an oxygen plasma and subsequently by flowing a mixed gas of oxygen (90%) and water vapor (10%). The mixed gas flow maintains the high initial ashing rate.

In the fourth embodiment, the oxygen in the third embodiment was simply replaced by an ashing process gas composed of oxygen (90% in vol.) and water vapor (10% in vol.). The result shown in FIG. 8 is essentially the same as that of the third embodiment.

Figure 3:
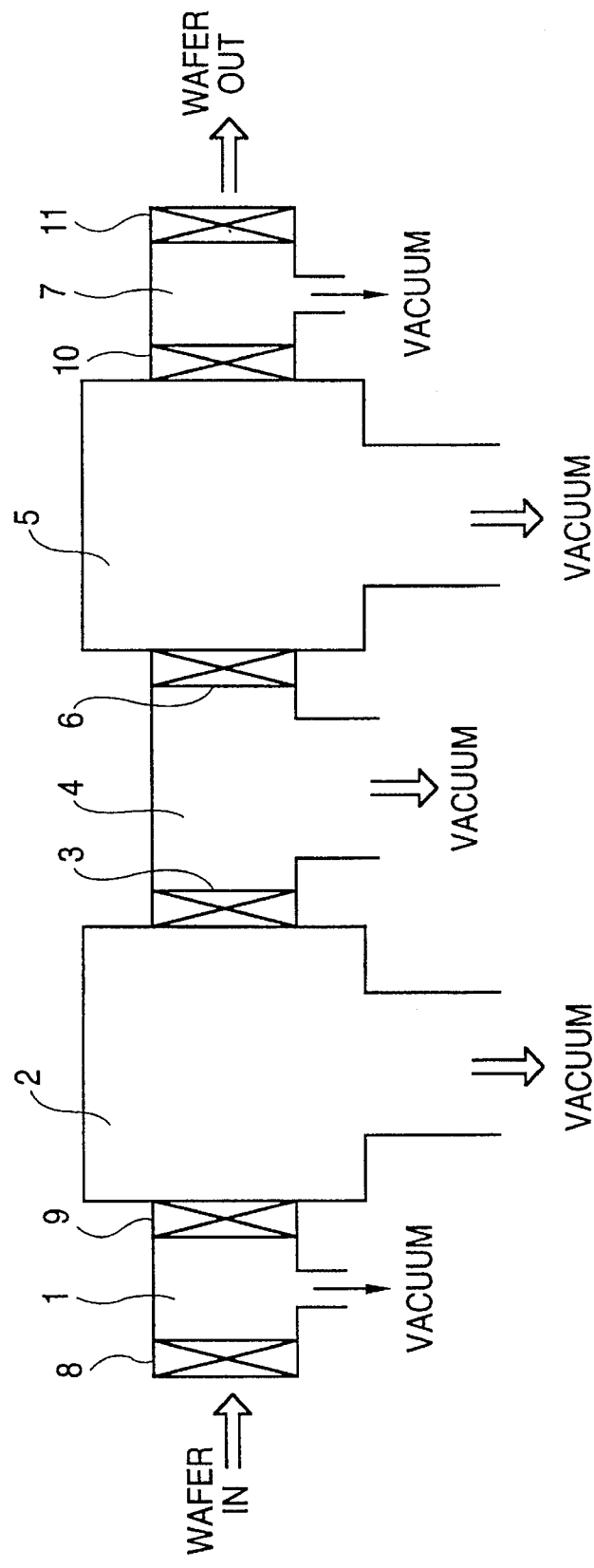
FIG. 3 is a schematic illustration of a plasma reaction system for ashing a photoresist on a wafer according to the present invention. First and second reaction chambers 2, 5 are connected to a wafer transfer chamber 4 by first and second vacuum tight valves 3, 6, respectively.

In the fifth embodiment, FIG. 3 shows the plasma reaction system for the present embodiment comprising the first plasma reaction chamber 2, the second plasma reaction chamber 5, the first wafer transfer chamber 1, the second wafer transfer chamber 4, and the third wafer transfer chamber 7. Each of the wafer transfer chambers 1, 4 and 7 has two vacuum tight valves. The vacuum tight valves 8 and 9 are located between the first wafer transfer chamber 1 and respectively the atmosphere and the first plasma reaction chamber 2. The vacuum tight valves 3 and 6 are located between the second wafer transfer chamber 4 and respectively the first plasma reaction chamber 2 and the second plasma reaction chamber 5. The vacuum tight valves 10 and 11 are located between the third wafer transfer chamber 7 and, respectively, the second plasma reaction chamber 5 and the atmosphere, respectively. All of the chambers can be evacuated by the vacuum system. In operation, when a wafer came into the first wafer transfer chamber 1 from the atmosphere, the valve 8 was open and the valve 9 was closed. After the first wafer transfer chamber 1 was evacuated sufficiently, the wafer was transferred to the first plasma reaction chamber 2 with the valve 8 closed and the valve 9 open. This load-locked sequence of these valve operations prevented the air from entering the first plasma reaction chamber 2, where halide gases were used for etching metal layers on the wafer. After the metal layers were etched, to form interconnection patterns, by halide gases, the wafer was transfered to the wafer transfer chamber 4, with the valve 3 open and the valve 6 closed, and then to the second plasma reaction chamber 5 with the valve 3 closed and the valve 6 open. This sequence prevented the halide gases from entering the second plasma reaction chamber 5. It usually takes 180 sec for the wafer to be transfered from the first plasma reaction chamber 2 to the second plasma reaction chamber 5. According to the fifth embodiment of the present invention, immediately before the valve 6 was opened to transfer the wafer into the second plasma reaction chamber 5 from the second wafer transfer chamber 4, the ashing process gas was flowed into the second plasma reaction chamber 5 for 170 sec. After that, the wafer was transferred to the second plasma reaction chamber 5 for ashing. The ashed wafer was transfered to the third wafer transfer chamber 7 with the valve 10 open and the valve 11 closed, and then the wafer came out of the third wafer transfer chamber 7 to the atmosphere with the valve 10 closed and the valve 11 open, whereby the air was prevented from entering the second plasma reaction chamber 5. A remarkable feature in this embodiment is that decreasing the ashing rate was prevented similarly to the first embodiment, and that without changing the timing sequence of the processes from the conventional one.

In the sixth embodiment, after aluminum-copper-titanium layers on a wafer were successively etched to form interconnection patterns in the first plasma reaction chamber 2 of the plasma reaction system shown in FIG. 3, the wafer was transferred to the wafer transfer chamber 4 with the valve 3 open and the valve 6 closed, and then to the second plasma reaction chamber 5 with the valve 3 closed and the valve 6 open. Similarly to the fifth embodiment, the process gas was flowed in the second plasma reaction chamber 5 with a flow rate of 1000 sccm and 1.0 Torr for 170 sec immediately before the valve 6 was opened to transfer the wafer into the second plasma reaction chamber 5 from the wafer transfer chamber 4. After that, the wafer was transferred to the second plasma reaction chamber 5 for ashing. In this embodiment, the same result was obtained as in the fifth embodiment, that is, prevention from decreasing the ashing rate again was obtained as well as without changing the timing sequence of the processes.

The technique according to the present invention is capable of maintaining the highest productivity of wafers by avoiding instability of the ashing rate.

We claim:

1. A method for ashing a resist on a wafer in a downstream plasma ashing apparatus which has a plasma generation chamber in which a plasma is generated from a gas by introducing microwaves into the gas, a plasma reaction chamber in which the wafer is loaded and a shower-head which is disposed between and separates the plasma generation chamber and the plasma reaction chamber and prevents charged particles and microwaves from penetrating into the plasma reaction chamber but which allows electrically neutral reactive species to flow into the plasma reaction chamber, the gas being introduced into the plasma generation chamber and exhausted from an end of the plasma reaction chamber remote from the shower-head, the method comprising the steps of:

maintaining a flow of the gas, which is a non-activated oxygen containing gas, into the plasma reaction chamber prior to generation of the plasma in the plasma generation chamber;

loading a wafer having the resist thereon into the plasma reaction chamber; and generating the plasma for carrying out ashing of the resist.

2. The method according to claim 1, wherein the non-activated oxygen containing gas is an essentially pure oxygen gas.

3. The method according to claim 1, wherein the non-activated oxygen containing gas is a mixed gas of oxygen and water vapor.

4. The method according to claim 1, wherein the non-activated oxygen containing gas is essentially the same gas as a gas used for an ashing process.

5. The method according to claim 1, wherein the flow of the non-activated oxygen containing gas into the plasma reaction chamber is maintained for at least 30 seconds.

6. The method according to claim 1, wherein the non-activated oxygen containing gas is flowed into the plasma reaction chamber immediately after a period of time during which plasma generation is carried out in the plasma generation chamber.

7. The method according to claim 6, wherein the plasma generation is performed for at least 30 seconds.

8. The method according to claim 6, wherein the flow of the non-activated oxygen containing gas into the plasma reaction chamber is maintained for at least 30 seconds.

9. A method for ashing a wafer having a resist thereon, by single wafer processing in situ in a downstream plasma ashing apparatus which has a plasma generation chamber in which a plasma is generated from a gas by introducing microwaves into the gas, a plasma reaction chamber in which the wafer is loaded and a shower-head which is disposed between and separates the plasma generation chamber and the plasma reaction chamber and prevents charged particles and microwaves from penetrating into the plasma reaction chamber but which allows electrically neutral reactive species to flow into the plasma reaction chamber, the gas being introduced into the plasma generation chamber and exhausted from an end of the plasma reaction chamber remote from the shower-head, the method comprising the steps of:

turning off the plasma; and maintaining a flow of the gas, which is a non-activated oxygen containing gas, into the plasma reaction chamber immediately before ashing the wafer, wherein the non-activated oxygen containing gas is selected from the group consisting of an essentially pure oxygen gas, a mixed gas of oxygen and water vapor and essentially the same gas as a gas used for an ashing process.

10. The method according to claim 9, wherein the flow of the non-activated oxygen containing gas into the plasma reaction chamber is maintained for at least 30 seconds.

11. A method for ashing a resist in a downstream plasma ashing apparatus which has a plasma generation chamber in which a plasma is generated from a gas by introducing microwaves into the gas, a plasma reaction chamber in which the wafer is loaded and a shower-head which is disposed between and separates the plasma generation chamber and the plasma reaction chamber and prevents charged particles and microwaves from penetrating into the plasma reaction chamber but which allows electrically neutral reactive species to flow into the plasma reaction chamber, the gas being introduced into the plasma generation chamber and exhausted from an end of the plasma reaction chamber remote from the shower-head, the method comprising the steps of:

evacuating the plasma generation chamber and the plasma reaction chamber, after being exposed to the atmosphere;

flowing the gas, which is a non-activated oxygen containing gas, into the plasma reaction chamber, wherein the gas is selected from the group consisting of an essentially pure oxygen gas, a mixed gas of oxygen and water vapor and essentially the same gas as a gas used for an ashing process;

loading a wafer having the resist thereon into the plasma reaction chamber; and carrying out the ashing process by turning on the plasma reaction chamber.

12. A method for ashing a resist in a downstream plasma ashing apparatus which has a plasma generation chamber in which a plasma is generated from a gas by introducing microwaves into the gas, a plasma reaction chamber in which the wafer is loaded and a shower-head which is disposed between and separates the plasma generation chamber and the plasma reaction chamber and prevents charged particles and microwaves from penetrating into the plasma reaction chamber but which allows electrically neutral reactive species to flow into the plasma reaction chamber, the gas being introduced into the plasma generation chamber and exhausted from an end of the plasma reaction chamber remote from the shower-head, the method comprising the steps of:

generating a plasma of a gas for an ashing process in the plasma generation chamber;

turning off the plasma;

flowing the gas for the ashing process in a non-activated state into the plasma reaction chamber;

subsequently introducing the wafer having the resist thereon into the plasma reaction chamber; and turning on the plasma.

13. A method for ashing a resist on a wafer by a multi-chamber dry processing system, wherein the system comprises a wafer transfer chamber which is connected to a first reaction chamber by a first vacuum tight valve, to a second reaction chamber by a second vacuum tight valve and to an evacuation pump, halide gases being used in the first reaction chamber for a dry etching process and the resist on the wafer being removed by a down-stream plasma ashing process in the second reaction chamber, a plasma generation chamber and a shower head, the shower head separating the second reaction chamber from the plasma generation chamber and preventing charged particles and microwaves from penetrating into the second plasma reaction chamber but allowing electrically neutral reactive species to flow into the second plasma reaction chamber, a gas used for the second reaction chamber being introduced into the plasma generation chamber and being exhausted at an end of the second plasma reaction chamber remote from the shower-head, the method comprising the steps of:

completing the dry etching process for a wafer having a photo-resist thereon in the first reaction chamber by turning off a plasma and evacuating the first reaction chamber;

opening a first vacuum tight valve thereby to transfer the wafer from the first reaction chamber to the wafer transfer chamber and then closing the first vacuum tight valve;

maintaining a flow of the gas, which is a non-activated oxygen containing gas, into the second reaction chamber by turning off microwave power into the plasma generation chamber, wherein the gas is selected from the group consisting of an essentially pure oxygen gas, a mixed gas of oxygen and water vapor and essentially the same gas as a gas used for an ashing process;

stopping the flow of the non-activated oxygen containing gas, and then opening a second vacuum tight valve to transfer the wafer from the wafer transfer chamber into the second reaction chamber;

closing the second vacuum tight valve and then flowing the gas used for an ashing process into the second reaction chamber; and carrying out the ashing of the resist on the wafer in the second reaction chamber.

* * * * *